United States Patent [19]

Kearney et al.

[11] Patent Number: 4,866,312

[45] Date of Patent: Sep. 12, 1989

[54] DIFFERENTIAL VOLTAGE TO CURRENT CONVERTER

[75] Inventors: Mark B. Kearney, Kokomo; Dennis M. Koglin, Indianapolis, both of Ind.

[73] Assignee: Delco Electronics Corporation, Kokomo, Ind.

[21] Appl. No.: 240,699

[22] Filed: Sep. 6, 1988

[51] Int. Cl.$^4$ .................. H03F 3/45; H03K 3/01; H03L 5/00; G05F 3/16
[52] U.S. Cl. .................................. 307/496; 307/270; 307/264; 323/315; 323/316; 330/257; 330/288
[58] Field of Search .............. 307/496, 270, 264, 310, 307/455, 467; 323/315, 316; 330/257, 288

[56] References Cited

U.S. PATENT DOCUMENTS

| | | | |
|---|---|---|---|
| 3,699,464 | 10/1972 | Zobel | 330/257 |
| 4,056,740 | 11/1977 | Schoeff | 307/496 |
| 4,238,738 | 12/1980 | Komori | 330/288 |
| 4,529,946 | 7/1985 | Kusakabe | 330/257 |
| 4,701,719 | 10/1987 | Nagata | 330/257 |

FOREIGN PATENT DOCUMENTS 0099674 7/1980 Japan ............................ 307/496
1185571 10/1985 U.S.S.R. ....................... 330/257

OTHER PUBLICATIONS

Pp. 503-508, Glaser and Subak-Sharpe, Integrated Circuit Engineering, 1979.

Primary Examiner—Stanley D. Miller
Assistant Examiner—Trong Quang Phan
Attorney, Agent, or Firm—Robert M. Sigler

[57] ABSTRACT

A bipolar integrated circuit differential voltage to current converter comprises a current source and a current sink at a lower current with two parallel branches connected therebetween. Each branch comprises, from the current source, a resistor, an input transistor with an emitter connected to the resistor and a mirror transistor with an emitter connected to the current sink. The resistors have equal resistance; the input transistors have bases comprising a differential voltage input; and the mirror transistors are connected in a current mirror arrangement. An output current is taken from the junction the resistor and the emitter of the input transistor connected thereto on the output side of the mirror so as to allow the current mirror to maintain equal currents and thus equal base/emitter voltages in the input transistors. A demand current sink transistor is connected in series with the current source with a base connected to the current sink so as to take excess current from the current source not taken by the current sink and current output and thus maintain the currents through the input transistors low for minimal input loading.

5 Claims, 3 Drawing Sheets

DIFFERENTIAL VOLTAGE TO CURRENT CONVERTER

BACKGROUND OF THE INVENTION

This invention relates to a differential voltage to current converter for use in a bipolar integrated circuit. The function of such a converter is to generate an output current proportional to a differential input voltage.

One goal in designing such a circuit is the greatest accuracy in its operation. The prior art in such circuits includes a circuit comprising a current source with an output supplying two parallel current paths, each comprising a resistor, an input transistor and a mirror transistor in series. The resistors have equal resistances; the input transistors have emitters connected to the resistors and bases comprising a differential voltage input; and the mirror transistors are connected in a current mirror arrangement so that the current in one is mirrored in the other.

This prior art circuit generates a differential output current, which is obtained from the junction of the input and mirror transistors on the dependent current side. However, this output current flows through only one of the input transistors and thus unbalances the input transistor emitter currents and thus their base/emitter voltages. The difference in base/emitter voltages on the input transistors produces an error in the operation of the device.

In addition, the circuits of the prior art generally require a comparatively large current through the input transistors; and this loads the input circuit providing the differential voltage input.

SUMMARY OF THE INVENTION

The differential voltage to current converter of this invention provides greater accuracy than those circuits typical of the prior art by ensuring that equal emitter currents flow in the input transistors at all times so that their base/emitter voltages remain equal. In addition, it provides for greatly reduced, constant currents in the input transistors for reduced input loading and stable operation.

In particular, the invention comprises a bipolar integrated circuit differential voltage to current converter comprising a first current generator establishing a first constant current, a second current generator establishing a second constant current less than the first constant current, first and second resistors of equal resistance each having one end connected to the output of the first current generator, first input and mirror transistors connected in series with the first resistor between the first and second current generators, and second input and mirror transistors connected in series with the second resistor between the first and second current generators. The first and second input transistors have emitters connected to the first and second resistors, respectively, with equal emitter areas and bases providing a differential voltage input. The first and second mirror transistors have emitters connected to the second current generator and bases interconnected in a current mirror arrangement wherein current through the first mirror transistor is mirrored to the second mirror transistor.

The converter of the invention further comprises a current output from the junction of the second resistor and emitter of the second input transistor providing an output current, in operation of the converter, proportional to the differential voltage input. The output current, which is derived from the first current source through the second resistor, is thus diverted from the second input transistor so that the currents, and thus the base/emitter voltages, in the first and second input transistors will be substantially equal for improved accuracy.

The converter further comprises a demand current sink transistor connected in series with the first current generator and having a base connected to the second current generator so as to take excess current from the first current generator not taken by the second current generator and current output and thus substantially reduce the currents through the first and second input transistors for reduced input loading. These currents are maintained constant by the second current generator for stable circuit operation with changes in temperature.

A refinement in one embodiment of the invention comprises an additional transistor having a base connected to the collector of the fourth transistor and biased to conduct base/emitter current equal to the combined base drives of the second and fourth transistors for further equalizing of the emitter currents and thus the base/emitter voltages in the first and third transistors. This overcomes a secondary effect inaccuracy due to the current mirror arrangement. Further details and advantages of the invention will be apparent from the accompanying drawings and following description of a preferred embodiment.

DESCRIPTION OF THE PREFERRED EMBODIMENT

Figure 1:
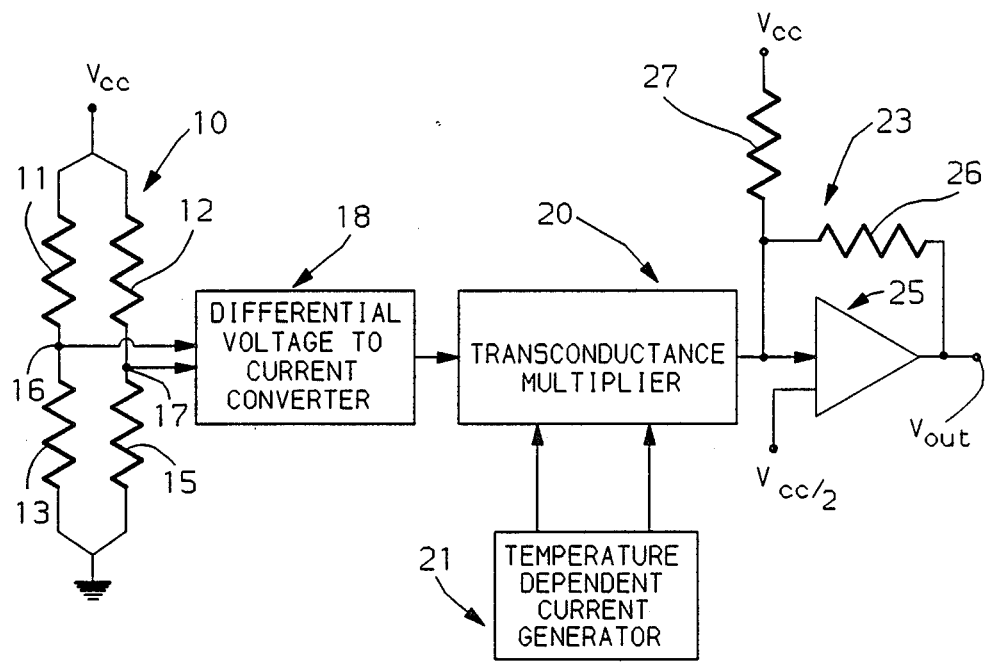
FIG. 1 shows a block and schematic diagram of an apparatus including a preferred embodiment of the invention.

Referring to FIG. 1, a bridge circuit 10 comprises piezoresistors 11, 12, 13 and 15 connected so that a supply voltage $V_{cc}$ is applied to one end each of piezoresistors 11 and 12 with ground applied to one end each of piezoresistors 13 and 15. The differential bridge output is taken from the junction 16 of piezoresistors 11 and 13 and the junction 17 of piezoresistors 12 and 15 and applied to the differential inputs of a differential voltage to current converter 18, in which an output current is generated which is proportional to the differential input voltage. This output current is provided to a transconductance multiplier 20, in which it is multiplied by the ratio of a pair of compensation currents generated in temperature dependent current generator 21 to provide a compensated output current. The compensated output current is converted to a compensated output voltage and amplified in an output amplifier circuit 23 comprising an operational amplifier 25 with a feedback or output resistor 26, an offset adjustment resistor 27 and a biasing reference voltage $V_{cc}/2$. The output of amplifier circuit 23 is the output voltage $V_{out}$ of the apparatus of the invention.

Figure 3:
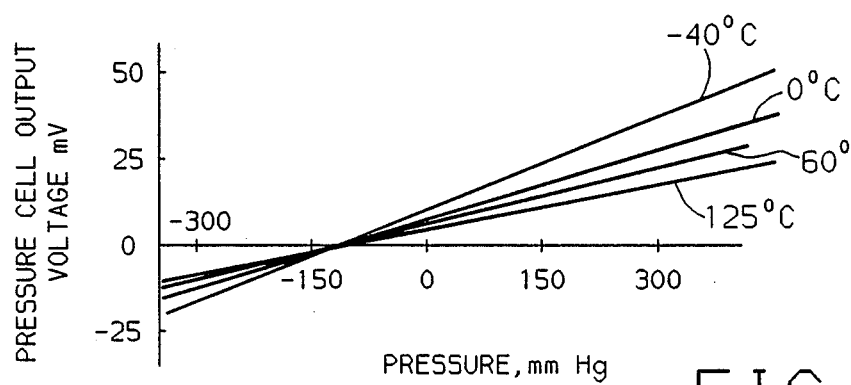
FIG. 3 shows a family of curves of output voltage vs. pressure for a pressure cell for use with the apparatus of FIG. 1.

The temperature dependence of a piezoresistive bridge pressure cell is shown in the curves of FIG. 3, which are curves of pressure cell output voltage as a function of pressure at a number of temperatures as indicated. It can be seen that all curves cross in a single point at one value of the input physical parameter: that is, value of the input physical parameter for which the output voltage is temperature independent. In FIG. 3, this is shown as a null value: that is, the voltage level is zero over the entire usable temperature range. Although all such pressure cells have a point at which the curves of different temperatures cross, this does not automatically occur at a zero voltage level. It is necessary for the correct operation of the apparatus of this invention that the pressure cell be nulled with the crossing point on the zero voltage axis. This can be accomplished in an elevated temperature wafer test. While the pressure cells are still in silicon wafer form, the cavities are etched to form diaphragms and the cells are electrostatically bonded to a 60 mil thick glass plate and subjected to output testing at room temperature and an elevated temperature, with trimming adjustment of one of the piezoresistors to produce the nulled pressure cell output. The testing and adjustment must take place after the cells are electrostatically bonded to the glass, since the bonding process changes the cell characteristics with respect to this variable. The production of a nulled pressure cell eliminates the requirement of any elevated temperature functional tests of the temperature compensation circuit of the invention.

Current Sources

Figure 2A:
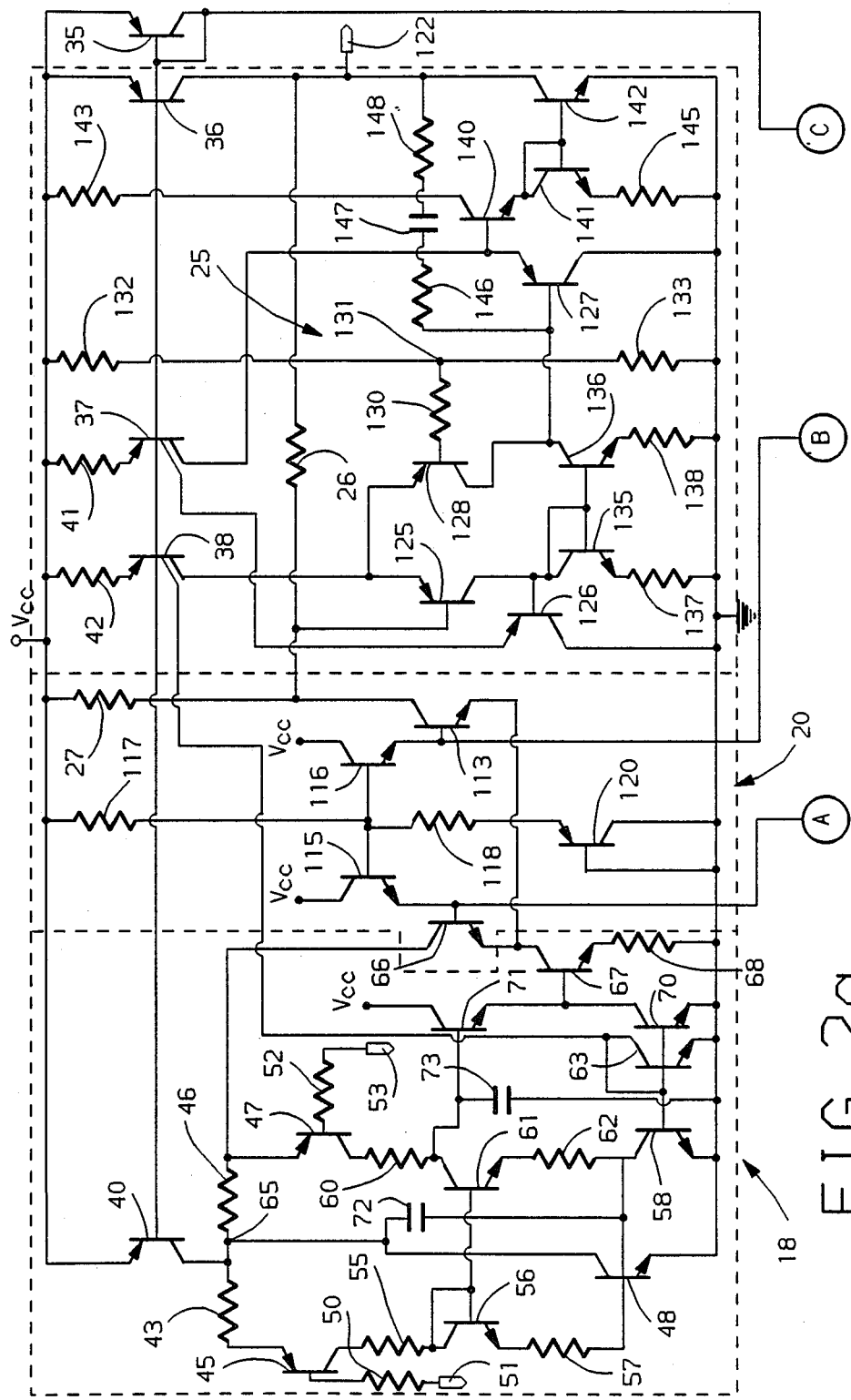
FIGS. 2a and 2b together show a complete circuit diagram of the apparatus of FIG. 1.
Figure 2B:
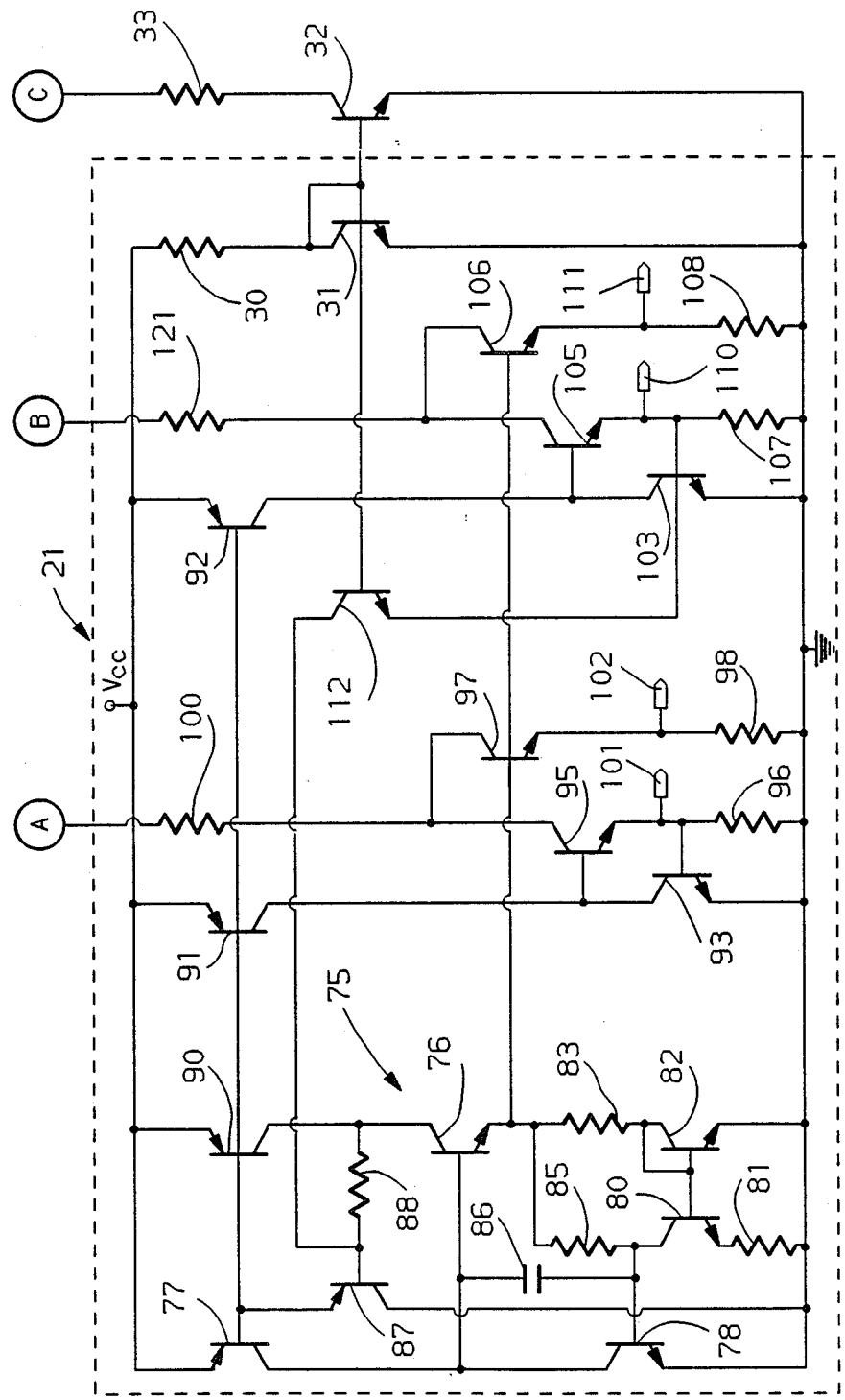

FIGS. 2a and 2b show the apparatus of the invention in greater circuit detail. Since this circuit is implemented in bipolar technology, all transistors identified are bipolar transistors. Referring first to FIG. 2b, a resistor 30 (14K) and NPN transistor 31 are connected in series between supply voltage $V_{cc}$ and ground. The supply voltage $V_{cc}$ is the high terminal of a standard DC electric power supply capable of providing electric current as required by a load at the supply voltage $V_{cc}$, which is nominally, for example, 5.1 volts. Transistor 31 is diode connected with its collector short circuited to its base; and its base is further connected to the base of another NPN transistor 32 having a grounded emitter and a collector connected through a crossunder resistor 33 (500 ohms) to the collector of a PNP transistor 35, shown in FIG. 2a, which has an emitter connected to supply voltage $V_{cc}$ and a base short circuited to its collector for another diode connection. A crossunder resistor is a resistor which is included for circuit layout purposes where one conduction path must cross another. It is not desired for circuit operation but, with the resistance indicated, does not adversely affect circuit operation significantly. This and several other crossunder resistors in the circuit are shown since they were used in the layout of the embodiment when constructed and tested. With a circuit layout not requiring them, they could be deleted.

In operation, transistor (diode) 31 conducts a constant current determined by supply voltage $V_{cc}$ and the resistance of resistor 30, the current level being, for example, 300 microamps. Transistor 32 is connected in a current mirror relationship with transistor 31 at one third the emitter area so that it is forced to conduct a constant current of 100 microamps, which current also flows through the series transistor (diode) 35.

Transistor 35 is connected in a current mirror relationship to determine the currents in a plurality of PNP transistors 36, 37, 38 and 40, shown in FIG. 2a, all of which have bases connected to the base of transistor 35. Transistor 36 has an emitter connected directly to supply voltage $V_{cc}$ and an emitter area four times that of transistor 35 providing a constant current of 400 microamps. Transistor 37 has an emitter connected to supply voltage $V_{cc}$ through a resistor 41 (2K) and an emitter area equal to that of transistor 35 for a constant current of 20 microamps. Transistor 38 has an emitter of area equal to that of transistor 35 which is connected to supply voltage $V_{cc}$ through a resistor 42 (6K) for a constant current of 12 microamps. Finally, transistor 40 is a current source with an emitter of area equal to that of transistor 35, the emitter of transistor 40 being directly connected to supply voltage $V_{cc}$ to provide a constant current of 100 microamps. Thus, the transistors described in this and the preceding paragraph all carry constant currents determined by the supply voltage, resistor 30 and their relative emitter areas.

Differential Voltage to Current Converter

Differential voltage to current converter 18 is shown at the left of FIG. 2a. The collector of transistor 40 is connected through a resistor 43 (4K) to the emitter of a PNP input transistor 45, through a resistor 46 (4K) to the emitter of a PNP input transistor 47 and directly to the collector of an NPN transistor 48 having a grounded emitter of area equal to that of transistor 32. The base of transistor 45 is connected through a crossunder resistor 50 (200 ohms) to a first differential input 51 of converter 18, which input 51 is connected, for example, to junction 16 of bridge circuit 10. The base of transistor 47 is connected through a crossunder resistor 52 (200 ohms) to a second differential input 53 of converter 18, which input 53 is connected, for example, to junction 17 of bridge circuit 10. The output of bridge circuit 10 is thus applied across the bases of transistors 45 and 47 as a differential input voltage $V_{dif}$ to converter 18. Converter 18 requires, for proper operation, that $V_{dif}$, if not zero, be applied with the higher voltage on terminal 51 and the lower on terminal 52. Transistors 45 and 47 each have emitter areas twice that of transistor 40.

The collector of transistor 45 is connected through a crossunder resistor 55 (774 ohms) to the collector of an NPN mirror transistor 56 having an emitter connected through a resistor 57 (25K) to the collector of an NPN transistor 58 with a grounded emitter of area equal to that of transistor 32. The collector of transistor 47 is connected through a crossunder resistor 60 (774 ohms) to the collector of an NPN mirror transistor 61 having an emitter connected through a resistor 62 (25K) to the collector of transistor 58. Thus, transistor 45 has its current carrying terminals (emitter and collector) connected in series between resistor 43 and current carrying terminals (emitter and collector) of transistor 56. Likewise, transistor 47 has similar current carrying terminals connected in series between resistor 46 and similar current carrying terminals of transistor 61. The base of transistor 56 is connected to its collector in a diode connection and also to the base of transistor 61 to form a current mirror establishing equal currents through transistors 45 and 47. The base of transistor 48 is connected to the collector of transistor 58, the base of which is connected to the base of an NPN transistor 63 having a grounded emitter and a collector connected to the collector of transistor 38. Transistor 38 has a double collector, so that transistor 63, the base of which is also connected to its collector in a diode connection, receives half the current of transistor 38, or 6 microamps.

Transistors 58 and 63 have equal emitter areas, so the former is a current source sinking a constant current of 6 microamps. This current is equally divided by the current mirror arrangement of transistors 56 and 61, which thus carry 3 microamps each and force transistors 45 and 47 to carry the same currents.

Since input transistors 45 and 47 have equal emitter currents established therein and equal emitter areas, they have equal base/emitter voltages. The differential input voltage $V_{dif}$ applied between the bases of transistors 45 and 47 is translated upward by these equal base/emitter voltage drops to the emitters of transistors 45 and 47 so that the same voltage difference exists between the voltage drops across resistors 43 and 46. Thus, if $I_1$ is the current through resistor 43 and $I_2$ the current through resistor 46 (of equal resistance R), then $V_{dif}=I_2R-I_1R=(I_2-I_1)R$. The 100 microamp current from transistor 40 will be split at junction 65 of resistors 43 and 46, with a constant 3 microamps flowing through resistor 43 and the remainder split between resistor 46 and transistor 48. The current flowing through resistor 46 is determined by the relationship above as $I_2=I_1+V_{dif}/R$.

However, the emitter of transistor 47 is further connected to the collector of an NPN transistor 66 (part of transconductance multiplier 20), which transistor has an emitter connected to an NPN transistor 67 having an emitter of area equal to that of transistor 63 and grounded through a resistor 68 (1K). The base of transistor 67 is connected to the collector of an NPN transistor 70 with a grounded emitter and a base tied to the base of transistor 63 and is further connected to the emitter of an NPN transistor 71 with a collector tied to supply voltage $V_{cc}$ and a base connected to the collector of transistor 61. The output current of differential voltage to current converter 18 is the current flowing into the collector of transistor 66. The current $I_2$ through resistor 46 is thus further split between a current equal to $I_1$ drawn off through transistor 47 due to the current mirror of transistors 56 and 61 and the output current $(I_2-I_1)=V_{dif}/R$. This establishes the basic relationship of the differential voltage to current converter: that is, the output current is proportional to the differential input voltage.

It can be seen that, if the differential input voltage $V_{dif}$ is zero, so must be the output current into the collector of transistor 66. Since there will be only 3 microamps drawn off through each of transistors 45 and 47, the remaining 94 microamps of the total 100 microamps supplied by transistor 40 must flow through transistor 48. This is ensured by the fact that transistor 48 is driven by the current mirror in such a way as to take the extra current. If more current than the 3 microamps begins to flow through transistors 56 and 61, additional base drive current is supplied to transistor 48. Since transistor 58 cannot take the additional current, the total additional current from both transistors 56 and 61 forms this base drive current, which is greatly amplified by the beta of transistor 48 as it increases the current therethrough. The result is a great increase in the current through transistor 48 for a very small increase in the current through transistors 56 and 61, with the current through the latter transistors remaining equal to each other.

The same works in reverse. As the differential input voltage $V_{dif}$ increases and causes the output current $I_2-I_1$ to increase and the current through transistors 56 and 61 to attempt to decrease, an increasing portion of this 94 microamps will be shunted away from transistor 48 through resistor 46 in order to establish the voltage drop in resistor 46 necessary to allow the base of transistor 45 to exceed that of transistor 47 by the differential input voltage $V_{dif}$ and generate the required output current. Transistor 48 thus operates as an "on demand" current sink to take the current from transistor 40 not required for the output to transistor 66.

The low current (3 microamps) through each of transistors 45 and 47 established by current sink transistor 58 provide a reduction over the prior art in input loading for the circuit, since these transistors will require less base drive from an input drive circuit such as bridge circuit 10. In addition, there is another benefit from the reduction in input transistor current. The equation produced above is substantially correct but actually includes at least one additional term describing a secondary effect. The equation with this additional term is $(I_2-I_1)=V_{dif}/R_{46}-I_s(1-R_{43}/R_{46})$. In this form of the equation, $R_{43}$ and $R_{46}$ are the resistances of resistors 43 and 46, respectively, which are not assumed to be absolutely equal, and $I_s$ is the current through transistor 45 or transistor 47. If $R_{43}=R_{46}$, the additional term reduces to zero; but, if they are not equal, the additional term provides a secondary effect inaccuracy proportional to the current through an input transistor. Thus, reduction in this current reduces this inaccuracy.

Current sink transistor 58, by providing a constant current through each input transistor, helps stabilize the circuit against the effects of varying temperature. If transistor 58 were not present, the currents through transistors 45 and 47 would each be half the base current of transistor 48, which would have a grounded emitter. As a current sink, this would be more temperature sensitive than the circuit as shown.

Additional circuit elements help ensure the accuracy of the circuit by eliminating or reducing error due to secondary effects. Transistors 71 and 67, together with resistor 68, help fix the collector voltage of transistor 61. Transistor 70, which has an emitter area equal to that of transistor 63 and thus is forced to carry a similar current of 6 microamps, makes the current mirror of transistors 56 and 61 closer to a perfect current mirror by establishing essentially the same current through transistor 71. Transistor 71 has twice the emitter area of transistors 56 and 61, which have emitter areas twice that of transistor 63; and it thus, through its base drive, shunts current from the collector of transistor 61 equal to that shunted from the collector of transistor 56 to the bases of transistors 56 and 61. This causes the currents through transistors 45 and 47 to be more perfectly equal and eliminates an error which, although small because it is associated with base drives which are a beta factor smaller than the emitter and collector currents through the transistors, nevertheless may be important for absolute accuracy in the circuit.

Other circuit elements stabilize the circuit against oscillation of the internal feedback loops. A capacitor 72 (15pF) connected from junction 65 of resistors 43 and 46 to the collector of transistor 58 is used for compensation to stabilize a feedback loop created around the current mirror of transistors 56 and 61 and the differential inputs of the circuit. Another capacitor 73 (5pF) connected from the collector of transistor 61 to ground, together with resistor 68, stabilizes another feedback loop around transistors 71, 67, 66 and 47.

Temperature Dependent Current Generator

The temperature dependent current generator 21 used to generate the compensation currents is shown in FIG. 2b. On the left of the Figure, a band gap voltage generator 75 establishes a temperature independent voltage of 1.24 volts at the emitter of an NPN transistor 76, which has an area equal to that of transistor 32. Transistor 76 has a base connected to the collector of a PNP transistor 77 with an emitter equal in area to that of transistor 76 and connected to supply voltage $V_{cc}$ and to the collector of an NPN transistor 78 with a grounded emitter. The base of transistor 78 is connected to the collector of an NPN transistor 80 having an emitter of area three times that of transistor 76 and grounded through a resistor 81 (450 ohms) and a base connected to the base of another NPN transistor 82 having a grounded emitter with one third the area of that of transistor 80 and a collector connected through a resistor 83 (9K) to the emitter of transistor 76 and to its own base for a diode connection. The base of transistor 78 is also connected through a resistor 85 (9K) to the emitter of transistor 76. A capacitor 86 (5 pF) is connected between the base and collector of transistor 78. The base of transistor 77 is connected to the emitter of a PNP transistor 87 having an emitter area equal to that of transistor 77, a grounded collector and a base connected through a crossunder resistor 88 (300 ohms) to the collector of transistor 76, which is further connected to the collector of a PNP transistor 90 having a base connected to the base of transistor 77 and an emitter connected to supply voltage $V_{cc}$.

Transistors 78, 80 and 82 comprise the band gap voltage generator. It operates in a manner known and described in the prior art by generating a voltage at the emitter of transistor 76 which is the sum of the voltage across resistor 85, which varies directly with temperature, and the base/emitter voltage of transistor 78, which varies inversely with temperature. If the components and output voltage are chosen correctly, the temperature effects will cancel each other in the sum over a useful temperature range for a temperature independent output voltage. The chosen output voltage for the components described is 1.24 volts.

It is helpful, although not absolutely necessary, to design the circuit so that substantially equal currents flow in transistors 78, 80 and 82 at room temperature. Resistors 83 and 85 are made equal in resistance, as already described; and transistors 90 and 77 are given a 2:1 emitter area ratio. The sum of the currents through transistors 80 and 82 is thus substantially equal to twice the current through transistor 78. In addition, the voltage at the lower connection of resistor 83 is equal to the base/emitter voltage of transistor 82; and the voltage at the lower connection of resistor 85 is equal to the base/emitter voltage of transistor 78. Transistors 78 and 82 have equal emitter areas. Equal currents through resistors 83 and 85 will produce substantially equal currents in transistors 80 and 82, which will both be equal to the current in transistor 78. The base/emitter voltages of transistors 78 and 82 will thus be equal; and this will cause equal voltages across resistors 83 and 85, which is consistent with equal currents therethrough. Thus the currents through transistors 78, 80 and 82 are substantially equal. The fact that identical currents flow in each of transistors 78, 80 and 82, while not absolutely necessary, does reduce some secondary effects and lead to better operation of the generator.

In operation, the base/emitter voltage of transistor 80 will have a smaller decrease with increasing temperature than the base/emitter voltage of transistor 82, since the emitter current density is smaller. Therefore, as temperature increases, the voltage across resistor 81 will increase; and this requires a greater current flow through resistor 81 and therefore through transistor 80 and resistor 85. This causes the voltage from the base of transistor 78 to the emitter of transistor 76 to increase; and this increase is by an amount just canceling the decrease in voltage at the base of transistor 78 due to the negative temperature coefficient of the base/emitter voltage of transistor 78. A similar action occurs with decreasing temperature, but with the directions reversed. Thus, the output voltage at the emitter of transistor 76 stays constant with varying temperature at 1.24 volts.

Transistor 87 reduces the loading (by a beta factor) on transistor 76 of the base currents of the biasing transistors 77 and 90, as well as several other similarly connected transistors not yet described. Capacitor 86 provides stabilizing compensation for the feedback loop around transistors 76, 82, 80 and 78.

The base of transistor 90 is connected to the bases of PNP transistors 91 and 92, each of which has an emitter connected to supply voltage $V_{cc}$. Transistor 91 has an emitter area half that of transistor 90 for a current of 65 microamps. Transistor 92 has an emitter area 1.5 times that of transistor 90 for a current of 195 microamps. The collector of transistor 91 is connected to the collector of an NPN transistor 93 having a grounded emitter and also to the base of an NPN transistor 95 having an emitter connected to the base of transistor 93 and through a resistor 96 to ground. The collector of transistor 95 is connected to the collector of an NPN transistor 97 having a base connected to the emitter of transistor 76 and an emitter grounded through a resistor 98. The collector of transistor 95 is also connected through a crossunder resistor 100 (733 ohms) to the base of transistor 66 in FIG. 2a. Transistors 93, 95 and 97 all have emitter areas equal to that of transistor 91.

Transistors 93, 95 and 97 comprise one of two current sinks within temperature dependent current generator 21. The current generated by this current sink is the sum of the currents through transistors 95 and 97. The current through transistor 97 depends on the voltage drop across resistor 98. Since the base of transistor 97 is fixed at 1.24 volts and the base/emitter junction varies inversely with temperature, the voltage across resistor 98, which is equal to the voltage on the base of transistor 97 minus the base/emitter drop thereof, varies directly with temperature. The current through transistor 95 depends on the voltage across resistor 96, which is equal to the base/emitter drop of transistor 93. Therefore, this voltage varies inversely with temperature. The sum of the currents of transistors 95 and 97 may be made to be temperature independent, linearly increase with temperature or linearly decrease with temperature, according to the resistance values picked for resistors 96 and 98. The situation is complicated by the facts that the currents are also affected by the respective resistor, 96 or 98, through which they flow and that these resistors vary with temperature. There are two ways of looking at the result: including the temperature varying resistance effect or ignoring it. The latter is possible since the ultimate use of the current will be in a ratio with a similarly derived current, in which ratio the resistive effects cancel. However, to describe the absolute compensation current which is the sum of the collector currents in transistors 95 and 97, the resistive effect may not be overlooked.

In order to provide a precise control of the current-/temperature function in production, test pads 101 and 102 are provided at the emitters of transistors 95 and 97, respectively. In production, resistor 98 is fixed at a predetermined value, and resistor 96 comprises a trimmable resistor lattice which is trimmed in production using standard trimming techniques to achieve the desired result. For example, resistor 98 may be 1.5K with resistor 96 having an untrimmed value of 6.9K, trimmable upwards by breaking fusible shunts in the resistor lattice. These values produce a compensation current as the sum of the collector currents of transistors 97 and 95 which is essentially temperature independent, since the tendency of the current to increase with temperature due to the voltage effects described is offset by the increase in resistance with temperature.

The other current sink within temperature dependent current generator 21 comprises NPN transistors 103, 105 and 106 of emitter area equal to that of transistor 91 and resistors 107 and 108. Transistor 103 has a collector connected to the collector of transistor 92, a grounded emitter and a base connected to the emitter of transistor 105, which is also grounded through resistor 107 and connected to a test pad 110. Transistor 105 further has a base connected to the collector of transistor 103 and a collector connected to the collector of transistor 106. Transistor 106 has a base connected to the emitter of transistor 76 and an emitter grounded through resistor 108 and connected to a test pad 111. The operation of this current sink is analogous to that of the previously described current sink. In this case, however, resistor 108 is provided with a resistance of 3K; and resistor 107 is provided with an untrimmed resistance of 2.7K for trimming upward to substantially 3K to produce a compensation current as the sum of the collector currents in transistors 105 and 106 which, due to the voltage effects described, would tend to be temperature independent. However, the increasing resistance of the resistors 107 and 108 with temperature causes the compensation current to decrease with temperature.

As will be seen in the description of transconductance multiplier 20, the ratio of the two compensation currents is the important factor; and this ratio is the temperature independent current from transistors 95 and 97 divided by the temperature decreasing current from transistors 105 and 106 for a compensation which increases with temperature. One can see that, if the temperature variation of the resistors were ignored, one could consider the voltage effects alone to produce a current from transistors 95 and 97 which increased with temperature divided by a current from transistors 105 and 106 which was temperature independent; and the ratio would be the same and would also increase with temperature.

The base of transistor 103 is further connected to the emitter of an NPN transistor 112 having a base connected to the base of transistor 31 and a collector connected to the base of transistor 87. Transistor 112 is used as a startup device for the circuit, which has a second stable operating point with essentially no current flowing in the band gap voltage generator or the current sinks. Transistor 112 has one third the emitter area of transistor 31 and would therefore carry 100 microamps of current if its emitter were grounded. Since the majority of its current flows to ground through resistor 107, its maximum current draw, at startup, will actually be less than this. However, it will draw sufficient current to force conduction of transistor 87 and generate currents in biasing transistors 77, 90, 91 and 92. This is sufficient to pull the circuit out of its quiescent stable state into its other stable state as described. As current flows through transistor 105, the voltage drop across resistor 107 will rise until the base/emitter junction of transistor 112 is reverse biased, at which point transistor 112 will cease conduction. However, by this time the circuit is in its active stable state; and transistor 112 is no longer needed.

It can be seen that, with a trimmed resistance of more than 7K in resistor 96 and a resistance of about 3K in resistor 107, the currents through transistors 95 and 105 will differ in the opposite ratio. This is the reason for the different emitter areas of transistors 91 and 92: they thus compensate for the different base drives required by the transistors of the two current sinks.

Transconductance Multiplier

Transconductance multiplier 20 is shown in detail in the middle of FIG. 2a. As already mentioned, the collector of transistor 66 receives the output current of differential voltage to current converter 18 and has an emitter connected to the collector of transistor 67. The emitter of transistor 66 is further connected to the emitter of an NPN transistor 113, which has and emitter area four times that of transistor 66 and a collector connected through offset adjustment resistor 27 (18K) to supply voltage $V_{cc}$. A pair of NPN transistors 115 and 116 have collectors connected to supply voltage $V_{cc}$ and bases connected through a resistor 117 (10K) to supply voltage $V_{cc}$ and through a resistor 118 (10K) to the emitter of a PNP transistor 120 having a grounded collector and base: essentially a diode to ground included to assist circuit operation at low supply voltages down to 3 volts. The emitter areas of transistors 115 and 116 are both equal to that of transistor 66. The emitter of transistor 115 is connected to the base of transistor 66 and, through crossunder resistor 100, to the collectors of transistors 95 and 97 of temperature dependent current generator 21. Similarly, the emitter of transistor 116 is connected to the base of transistor 113 and through a crossunder resistor 121 (533 ohms) to the collectors of transistors 105 and 106 of temperature dependent current generator 21.

The circuit described is a current multiplying circuit. The sum of the base/emitter voltages of transistors 66 and 115 equals that of transistors 113 and 116. Since the collector current is essentially a log function of base/emitter voltage in the active linear region, the product of the collector currents of transistors 66 and 115 equals that of transistors 113 and 116. However, the collector current of transistor 66 is the input current to the multiplier from differential voltage to current converter 18; and the collector current of transistor 113 is the compensated output current of transconductance multiplier 20. Therefore, the compensated output current of multiplier 20 equals the input current thereof times two factors. The first is the ratio of collector currents in transistors 116 and 115, which essentially equals the ratio of emitter currents in these transistors, which is the ratio of the compensating currents from the temperature dependent current generator 21 and thus varies in the predetermined manner to compensate the pressure cell signal for temperature. The collector current of transistor 113 is thus a temperature compensated signal, if a current output signal is acceptable. The second factor is four from the emitter area ratio of transistors 113 and 66. The additional gain factor of four improves the signal to noise ratio in view of a practical lower limit on the resistance of resistor 46 to keep down current through transistor 67 in the voltage to current converter and thus maintain stability from oscillation in the feedback circuit of transistors 47, 71, 67 and 66.

The specific compensation currents from temperature dependent current generator 21 as described produce, when applied t transconductance multiplier 20, a specific linear temperature dependence, as the ratio of the current in the current sink of transistors 93, 95 and 97, which decreases linearly with temperature, to that in the current sink of transistors 103, 105 and 106, which is invariant with temperature. This specific relationship was chosen to compensate for the known temperature variation of a piezoresistive bridge pressure sensor made in a certain manner. Other devices will require different functions, which may be designed into the current sinks. Each of the current sinks of this circuit as shown provides a linear temperature compensation by itself. As long as the desired compensating function is linear, one of the current sinks will be made temperature independent with the other current sink embodying the desired linear compensation. For a nonlinear compensation, this circuit may still be used with both compensating currents made to vary linearly with temperature according to the best fit of the ratio of the currents with temperature to the desired compensation. The apparatus of this invention thus allows a wide application to many such devices.

Current to Voltage Conversion and Output Amplifier

If an output voltage is desired, the output amplifier, which appears at the right side of FIG. 2a, is provided to convert the temperature compensated output current at the collector of transistor 113 to an amplified and compensated output voltage appearing at an output terminal 122. The collector of transistor 113 is connected to output terminal 122 through resistor 26, already described in connection with FIG. 1, and is further connected to the base of a PNP transistor 125 having an emitter connected to the other collector terminal of transistor 38. Transistor 125 further has a collector connected to the base of a PNP transistor 126 having a grounded collector and an emitter connected to one of two collector terminals of transistor 37, the other being connected to the emitter of a PNP transistor 127 having a grounded collector and a base connected to the collector of a PNP transistor 128. Transistor 128 has an emitter connected to the emitter of transistor 125 and equal thereto in area and a base connected through a resistor 130 (20K) to the junction 131 of a pair of series resistors 132 (10K) and 133 (10K) forming a voltage divider between $V_{cc}$ and ground. A pair of NPN transistors 135 and 136 have bases connected to each other and to the collector of transistor 135. The collector of transistor 135 is further connected to the collector of transistor 125 and the base of transistor 126; and the emitter of transistor 135 is grounded through a resistor 137 (20K). Transistor 136 has a collector connected to the collector of transistor 128 and to the base of transistor 127 and an emitter grounded through a resistor 138 (20K).

A high gain output stage for the amplifier comprises PNP transistor 127 and NPN transistors 140, 141 and 142, together with feedback resistor 26. Transistor 140 has a base connected to the emitter of transistor 127, a collector connected through a resistor 143 (15K) to supply voltage $V_{cc}$, and an emitter connected to the collector of transistor 141 and to the bases of transistors 141 and 142. Transistor 141 has an emitter grounded through a resistor 145 (5.2K); and transistor 142 has a grounded emitter and a collector connected to output terminal 122 and the collector of transistor 36. A resistor 146 (13K), capacitor 147 (20 pF) and resistor 148 (2K) are connected across the output stage in series between the base of transistor 127 and output terminal 122. All of transistors 125, 126, 127, 128, 135, 136, 140 and 141 have emitter areas equal to that of transistor 66; the emitter of transistor 142 has three times that area.

The amplifier circuit is conventional in operation. A midpoint bias voltage of $V_{cc}/2$ is established at junction 131 by the voltage divider of resistors 132, 133 on the base of transistor 128. The amplifier is a high gain operational amplifier; and the voltage $V_{cc}/2$ on the base of transistor 128 is thus also established on the base of transistor 125. This fixes a constant current through resistor 27. This current and the current through resistor 26 must add to equal the collector current of transistor 113. If the collector current of transistor 113 is zero, all the current from resistor 27 is diverted through resistor 26 toward output terminal 122; and the output voltage is below $V_{cc}/2$. As the collector current of transistor 113 increases, a decreasing proportion of the current from resistor 27 is diverted into resistor 26, with a consequent increase in the output voltage toward $V_{cc}/2$, until all the current is taken by transistor 113 and the amplifier output is $V_{cc}/2$. With additional increase in the collector current of transistor 113, an increasing current is drawn from resistor 26 to provide an increasing output voltage greater than $V_{cc}/2$. Thus, resistor 27 is called the offset adjustment resistor, since variation in its resistance will change the collector current of transistor 113 required for zero voltage output.

If the current converter and amplifier is used as described, the overall gain is proportional to the product of the temperature compensation factor, the resistance ratio of output resistor 26 to input resistor 46, and the factor four from the emitter area ratio of transistors 113 and 66. The temperature compensation factor, which is the ratio of the compensating currents from temperature dependent current generator 21, is designed to produce the desired temperature compensation. It is important, then, that this not be nullified by a temperature variation in the ratio of the input and output resistances. Care should be that these resistors vary identically with temperature and that they are packaged and mounted so as to be at the same temperature at all times.

The adjustment of resistors 96 and 107 in manufacture for the fixing of the temperature compensation currents has already been described. If the output amplifier is used, a functional test will be required to set offset adjustment resistor 27 and gain adjustment resistor 26. This test may be performed at room temperature.

The embodiments of the invention in which an exclusive property or privilege is claimed are defined as follows:

1. A bipolar integrated circuit differential voltage to current converter comprising, in combination:
   a first current generator establishing a first constant current;
   a second current generator establishing a second constant current less than the first constant current;

first and second resistors of equal resistance each having one end connected to the output of the first current generator;

first input and mirror transistors connected in series with the first resistor between the first and second current generators;

second input and mirror transistors connected in series with the second resistor between the first and second current generators, the first and second input transistors having emitters connected to the first and second resistors, respectively, with equal emitter areas and bases providing a differential voltage input, the first and second mirror transistors having emitters connected to the second current generator and bases interconnected in a current mirror arrangement wherein current through the first mirror transistor is mirrored to the second mirror transistor;

a current output from the junction of the second resistor and emitter of the second input transistor so as to provide an output current proportional to the differential voltage input, the output current thus being provided from the first current source through the second resistor but not through the second input transistor so that the emitter currents, and thus the base/emitter voltages, of the first and second input transistors are maintained substantially equal by the current mirror of the first and second mirror transistors; and a demand current sink transistor connected in series with the first current generator and having a base connected to the second current generator so as to take excess current from the first current generator not taken by the second current generator and current output, the currents in the first and second input transistors thus being held low for minimal input loading.

2. The bipolar integrated circuit differential voltage to current converter of claim 1 in which the bases of the first and second mirror transistors are connected to receive base drive current from the first current source through the first input transistor and further comprising:

a third current generator connected between the second input and mirror transistors to conduct a third constant current from the second input transistor and thereby divert it from the second mirror transistor, the third constant current being substantially equal to the combined base drive currents of the first and second mirror transistors so that the currents through the first and second input transistors are more perfectly equal.

3. The bipolar integrated circuit differential voltage to current converter of claim 2 in which the third current generator is an additional transistor having a base connected between the second input and mirror transistors and an emitter with two times the emitter area of the second mirror transistor and further current generating means establishing an emitter current in the additional transistor equal to the second constant current.

4. A bipolar integrated circuit differential voltage to current converter comprising, in combination:

an electric power source with supply voltage and ground terminals;

a current source establishing a first constant current from the supply voltage terminal of the electric power source;

a current sink establishing a second constant current to the ground terminal of the power source, the second constant current being less than the first constant current;

first and second resistors of equal resistance each having one end connected to the output of the current source;

first and second PNP transistors having emitters with equal emitter areas connected to the other ends of the first and second resistors, respectively, and further having bases providing a differential voltage input and collectors;

first and second NPN transistors having collectors connected to the collectors of the first and second PNP transistors, emitters of equal emitter area connected in series with the current sink and bases connected together and to the collector of the first NPN transistor in a current mirror arrangement wherein current through the first NPN transistor is mirrored to the second NPN transistor;

a current output from the junction of the second resistor and emitter of the second PNP transistor providing an output current, in operation of the converter, proportional to the differential voltage input, the output current thus being provided from the first current source through the second resistor but diverted from the second PNP transistor;

a third NPN transistor having a collector connected to the output of the current source and an emitter connected to the ground terminal of the electric power source and further having a base connected to the current sink so as to take excess current from the current source not taken by the current sink and current output;

a fourth NPN transistor having a collector connected to the supply voltage terminal of the electric power source, an emitter with twice the emitter area of the second NPN transistor and a base connected between the collectors of the second PNP and NPN transistors;

a fifth NPN transistor having an emitter connected to the ground terminal of the electric power source, a collector connected to the emitter of the fourth NPN transistor and a base; a base drive means connected to the base of said fifth NPN transistor and effective to establish an emitter current therein equal to the second constant current, whereby a current from the current source through the second PNP transistor equal to the combined base drive currents of the first and second NPN transistors is shunted away from the second NPN transistor, the emitter currents, and thus the base/emitter voltages, in the first and second PNP transistors being thus maintained equal; and circuit elements between the emitter of the fourth transistor and the ground terminal of the electric power source effective to restrict variation in the voltage at the collector of the second NPN transistor.

5. The bipolar integrated circuit differential voltage to current converter of claim 4 further comprising stabilizing compensation capacitors connected between the collector and base of the third NPN transistor and between the collector of the second NPN transistor and the ground terminal of the electric power source.

* * * * *